US012671382B2

(12) United States Patent (10) Patent No.: US 12,671,382 B2

Karasawa et al. (45) Date of Patent: Jun. 30, 2026

(54) DIFFERENTIAL AMPLIFIER CIRCUIT

(71) Applicant: HIOKI E.E. CORPORATION, Ueda (JP)

(72) Inventors: Yuki Karasawa, Ueda (JP); Koki Nakazawa, Ueda (JP); Kenta Ikeda, Ueda (JP); Kimihiko Yamagishi, Ueda (JP)

(73) Assignee: HIOKI E.E. CORPORATION, Ueda (JP)

( * ) Notice: Subject to any disclaimer, the term of this patent is extended or adjusted under 35 U.S.C. 154(b) by 547 days.

(21) Appl. No.: 18/246,988

(22) PCT Filed: Sep. 17, 2021

(86) PCT No.: PCT/JP2021/034396

§ 371 (c)(1),
(2) Date: Mar. 28, 2023

(87) PCT Pub. No.: WO2022/071000

PCT Pub. Date: Apr. 7, 2022

(65) Prior Publication Data

US 2023/0370035 A1 Nov. 16, 2023

(30) Foreign Application Priority Data

Oct. 2, 2020 (JP) ................................ 2020-168100

(51) Int. Cl.
H03F 3/45 (2006.01)
H03F 3/68 (2006.01)

(52) U.S. Cl.
CPC ................. H03F 3/68 (2013.01); H03F 3/45 (2013.01)

(58) Field of Classification Search
CPC .......... H03F 3/68; H03F 3/45; H03F 3/45968; H03F 2203/45138; H03F 2203/45152;
(Continued)

(56) References Cited

U.S. PATENT DOCUMENTS 6,396,343 B2 * 5/2002 Chee .................... H03F 3/45968
330/69
2013/0293304 A1 11/2013 Wan

FOREIGN PATENT DOCUMENTS

JP 63-171021 U1 11/1988
JP S63171021 U 11/1988
(Continued)

OTHER PUBLICATIONS

Tokiaki Ueda, "Check heart rate and stress on computer screen Production of electrocardiographs", Jan. 2006. vol. 43. No. 1. pp. 223-233; Jan. 2006. vol. 43. No. 1. pp. 223-233.
(Continued)

*Primary Examiner* — Andrea Lindgren Baltzell
*Assistant Examiner* — Kheim D Nguyen
(74) *Attorney, Agent, or Firm* — Conley Rose, P.C.

(57) ABSTRACT

A differential amplifier circuit includes a basic differential amplifier circuit including an operational amplifier configured to amplify a potential difference between output ends of a first input resistor and a second input resistor, a feedback resistor connected to the output end of the first input resistor, and a first resistance element connected to the output end of the second input resistor. Furthermore, the differential amplifier circuit includes a high-precision operational amplifier having an offset voltage or a drift voltage lower than that of the operational amplifier. The high-precision operational amplifier includes an inverting input terminal connected to the output end of the first input resistor and an output terminal connected to the output end of the second input resistor.

10 Claims, 10 Drawing Sheets

(58) Field of Classification Search
     CPC . H03F 2203/45212; H03F 2203/45586; H03F
                    2203/45588; H03F 3/45991; H03F
                                                3/45475
     USPC .......................................................... 330/69
     See application file for complete search history.

(56)                    References Cited

FOREIGN PATENT DOCUMENTS

JP         2015-119304 A      6/2015
JP          2020-25254 A      2/2020

OTHER PUBLICATIONS

Foreign Communication from a Related Counterpart Application,
Supplemental European Search Report and Written Opinion dated
Oct. 10, 2024, European Application No. 21875302.8 filed on Sep.
17, 2021.
Horowitz, et al., "The Art of Electronics—Differential and Instru-
mentation Amplifiers", Art of Electronics, Jan. 1980, Cambridge
University Press, GB, pp. 279-286, XP002044414.
Foreign Communication from a Related Counterpart Application,
Office Action dated Sep. 13, 2024, Japanese Patent Application No.
2020-168100 filed on Oct. 15, 2020.
Ueda, et al., "Production of a confirmation electrocardiogram the
computer screen," Transistor Technology, Jan. 2006, Japan, CQ
Publishing Co., Ltd., vol. 43, No. 1, pp. 223 to 233.

* cited by examiner

DIFFERENTIAL AMPLIFIER CIRCUIT

TECHNICAL FIELD

The present invention relates to a differential amplifier circuit.

BACKGROUND ART

JP 2020-25254 A discloses a differential amplifier circuit including an operational amplifier that amplifies a potential difference between output ends of a pair of input resistors, a feedback resistor disposed in a feedback path from an output terminal of the operational amplifier to one input terminal, and a resistance element connected to the other input terminal of the operational amplifier.

SUMMARY OF INVENTION

In a typical differential amplifier circuit such as described above, an error occurs in an output signal of the differential amplifier circuit due to an offset voltage or a drift voltage of the operational amplifier. As a countermeasure, the offset voltage or the drift voltage can be suppressed by replacing the operational amplifier with a high-precision operational amplifier having an offset voltage or a drift voltage lower than that of the operational amplifier. However, the performance of the differential amplifier circuit, such as a gain bandwidth product or a slew rate, may be limited by the replacement with the high-precision operational amplifier.

The present invention has been made in view of such problems, and an object of the present invention is to reduce, in a differential amplifier circuit, an offset voltage or a drift voltage while maintaining the performance of an operational amplifier.

According to an aspect of the present invention, a differential amplifier circuit includes a basic differential amplifier circuit including a first input resistor and a second input resistor configured to respectively receive two potential signals, an operational amplifier configured to amplify a potential difference between output ends of the first input resistor and the second input resistor, a feedback resistor connected to the output end of the first input resistor, and a first resistance element connected to the output end of the second input resistor. Furthermore, the differential amplifier circuit includes a high-precision operational amplifier including an inverting input terminal connected to the output end of the first input resistor and an output terminal connected to the output end of the second input resistor, the high-precision operational amplifier having an offset voltage or a drift voltage lower than an offset voltage or a drift voltage of the operational amplifier. Then, a potential corresponding to a potential appearing at a non-inverting input terminal of the operational amplifier with only the basic differential amplifier circuit is input as a reference signal to a non-inverting input terminal of the high-precision operational amplifier.

According to this aspect, since the potential corresponding to the potential appearing at the non-inverting input terminal of the operational amplifier with only the basic differential amplifier circuit is input to the non-inverting input terminal of the high-precision operational amplifier, a difference corresponding to the offset voltage or the drift voltage of the operational amplifier can be obtained at the output terminal of the high-precision operational amplifier. In accordance with this difference, negative feedback is applied from the inverting input terminal of the operational amplifier to the non-inverting input terminal of the operational amplifier via the high-precision operational amplifier, and thus the potential difference between the input terminals of the operational amplifier is reduced. This makes it possible to reduce the offset voltage or the drift voltage while maintaining the performance of the operational amplifier.

DESCRIPTION OF EMBODIMENTS

Embodiments of the present invention will be described below with reference to the accompanying drawings.

First Embodiment

Figure 1:
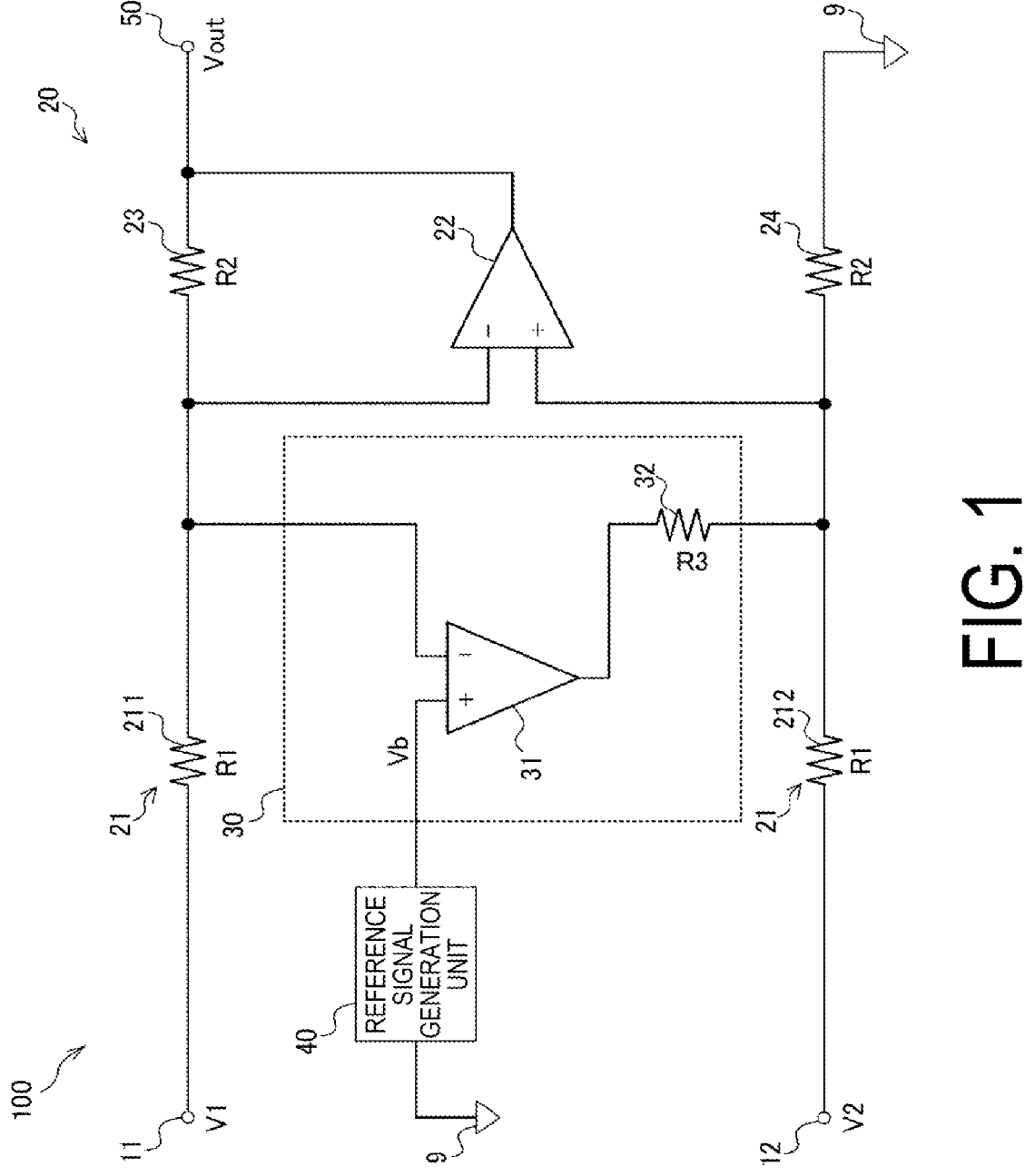
FIG. 1 is a circuit diagram illustrating a configuration of a differential amplifier circuit according to a first embodiment of the present invention.

FIG. 1 is a circuit diagram illustrating a configuration of a differential amplifier circuit according to a first embodiment.

A differential amplifier circuit 100 according to the present embodiment is an operational amplifier circuit that amplifies a difference between two potential signals, and includes a pair of input terminals 11,12, a basic differential amplifier circuit 20, an offset voltage suppression circuit 30, a reference signal generation unit 40, and an output terminal 50.

The pair of input terminals 11, 12 respectively receive first and second potential signals V1, V2 from the outside. Specifically, the first potential signal V1 is supplied to the first input terminal 11, and the second potential signal V2 is supplied to the second input terminal 12.

The basic differential amplifier circuit 20 includes a pair of input resistors 21, an operational amplifier 22, a feedback resistor 23, and a first resistance element 24.

The pair of input resistors 21 are two resistance elements to which the two potential signals V1, V2 are input, respectively. The pair of input resistors 21 are constituted by a first input resistor 211 and a second input resistor 212. Hereinafter, the first input resistor 211 and the second input resistor 212 are simply referred to as the input resistor 211 and the input resistor 212.

The input resistor 211 and the input resistor 212 in the present embodiment have resistance values R1 equal to each other. As an example, the resistance value R1 is set to 2 kΩ. An input end corresponding to one end of the input resistor 211 is connected to the first input terminal 11, and an input end of the input resistor 212 is connected to the second input terminal 12.

The operational amplifier 22 is an amplifier that amplifies a potential difference between an output end corresponding to the other end of the first input resistor 211 and an output end corresponding to the other end of the second input resistor 212. The operational amplifier 22 includes an inverting input terminal (−) to which a potential appearing at the output end of the input resistor 211 is applied, a non-inverting input terminal (+) to which a potential appearing at the output end of the input resistor 212 is applied, and an output terminal from which a differential signal based on a potential difference between the inverting input terminal (−) and the non-inverting input terminal (+) is output.

The operational amplifier 22 in the present embodiment is constituted by a typical operational amplifier for a direct current signal or an alternating-current signal. Alternatively, the operational amplifier 22 may be constituted by a high-speed operational amplifier having a gain bandwidth product of several MHz or greater, for example. The gain bandwidth product of the operational amplifier 22 is an index representing an upper limit of a frequency band having minimal gain variation.

The feedback resistor 23 is a resistance element disposed in a current path that feeds current from the output terminal of the operational amplifier 22 back to the inverting input terminal (−), and connected to the output end of the input resistor 211. The feedback resistor 23 is connected between the output terminal and the inverting input terminal (−) of the operational amplifier 22, and adjusting a resistance value R2 of the feedback resistor 23 changes an amplification factor of the basic differential amplifier circuit 20.

The resistance value R2 of the feedback resistor 23 may be the same as or may be different from the resistance value R1 of the input resistors 211, 212. The resistance value R2 of the feedback resistor 23 in the present embodiment is set to the same value, for example, 2 kΩ, as the resistance value R1 of the input resistors 211, 212.

The first resistance element 24 is a resistance element connected to the output end of the input resistor 212. The first resistance element 24 is connected to the reference potential terminal 9 set to a potential serving as a reference of the basic differential amplifier circuit 20. Adjusting a resistance value of the first resistance element 24 changes the amplification factor of the basic differential amplifier circuit 20.

The resistance value of the first resistance element 24 is set to the same value as that of the feedback resistor 23. In the present embodiment, the first resistance element 24 is set to the resistance value R2 equal to that of the feedback resistor 23, and the reference potential terminal 9 is set to 0 [V], which is the ground potential.

With such a configuration, in the basic differential amplifier circuit 20, the operational amplifier 22 amplifies the potential difference obtained by subtracting a potential of the second potential signal V2 from a potential of the first potential signal V1 at a magnification indicated by the value obtained by dividing the resistance value R2 by the resistance value R1, and outputs the amplified differential signal to the output terminal 50.

In a connection configuration of the basic differential amplifier circuit 20, a contact between the output end of the input resistor 211 and one end of the feedback resistor 23 is connected to the inverting input terminal (−) of the operational amplifier 22, and a contact between the output terminal of the operational amplifier 22 and the other end of the feedback resistor 23 is connected to the output terminal 50 of the differential amplifier circuit 100. Further, a contact between the output end of the input resistor 212 and one end of the first resistance element 24 is connected to the non-inverting input terminal (+) of the operational amplifier 22, and the other end of the first resistance element 24 is connected to the reference potential terminal 9.

Next, a configuration of the offset voltage suppression circuit 30 connected to the basic differential amplifier circuit 20 will be described.

The offset voltage suppression circuit 30 is an adjustment circuit for correcting an offset voltage or a drift voltage of the operational amplifier 22 constituting the basic differential amplifier circuit 20 to a lower value. The offset voltage suppression circuit 30 in the present embodiment includes a high-precision operational amplifier 31 and a second resistance element 32.

The high-precision operational amplifier 31 is an amplifier having an offset voltage lower than that of the basic differential amplifier circuit 20. In the present embodiment, an amplifier having a low offset voltage includes an amplifier having an offset voltage lower than that of the operational amplifier 22 and an amplifier having a drift voltage lower than that of the operational amplifier 22.

Examples of the high-precision operational amplifier 31 include a low-offset amplifier, a zero-drift amplifier, and a low-drift amplifier. The zero-drift amplifier has a typical circuit configuration employing, for example, an auto-zero method, a chopper method, or a combination thereof.

Note that a gain bandwidth product of the high-precision operational amplifier 31 having a configuration such as described above is likely to be narrower than the gain bandwidth product of the operational amplifier 22. In other words, an operating frequency range of the high-precision operational amplifier 31 tends to be narrower than an operating frequency range of the operational amplifier 22.

The high-precision operational amplifier 31 is disposed so that negative feedback is applied from the output end of the input resistor 212 to the output end of the input resistor 211 via two input terminals of the operational amplifier 22. That is, the high-precision operational amplifier 31 is disposed such that the voltage at the output end of the input resistor 211 is amplified, and the amplified voltage is applied to the output end of the input resistor 212.

Thus, the high-precision operational amplifier 31 feeds back the potential appearing at the inverting input terminal (−) of the operational amplifier 22, and applies an adjustment signal for reducing the difference between the fed-back potential and a reference signal Vb to the output end of the second resistance element 32.

In the present embodiment, the high-precision operational amplifier 31 includes a non-inverting input terminal (+) to which the reference signal Vb is input, an inverting input terminal (−) to which a potential appearing at the contact between the input resistor 211 and the feedback resistor 23 is applied, and an output terminal for outputting the adjustment signal described above.

A potential corresponding to a potential appearing at the non-inverting input terminal (+) of the operational amplifier 22 with only the basic differential amplifier circuit 20 is input as the reference signal Vb to the non-inverting input terminal (+) of the high-precision operational amplifier 31. The expression "with only the basic differential amplifier circuit 20" describes a state (circuit configuration) in which the offset voltage suppression circuit 30 is removed from the differential amplifier circuit 100.

As described above, the reference signal Vb input to the non-inverting input terminal (+) of the high-precision operational amplifier 31 is generated on the basis of the potential appearing at the non-inverting input terminal (+) of the operational amplifier 22 with only the basic differential amplifier circuit 20.

The magnitude of the reference signal Vb required to reduce the input offset voltage of the operational amplifier 22 using the high-precision operational amplifier 31 will now be described in detail. Note that the input offset voltage is a potential difference between the non-inverting input terminal (+) and the inverting input terminal (−) when the output voltage of the operational amplifier 22 is 0 V.

First, an output potential $V_{out}$ appearing at the output terminal of the operational amplifier 22 with the offset voltage suppression circuit 30 omitted from the differential amplifier circuit 100 can be expressed by equation (1) below.

Math 1

$$V_{out} = -\frac{R2}{R1}(V1 - V2) + \frac{R1 + R2}{R1}V_{off} \qquad (1)$$

Note that R1 is the resistance value of the pair of input resistors 21, and R2 is the resistance value of the feedback resistor 23 and the first resistance element 24. V1 is the potential appearing at the first input terminal 11, V2 is the potential appearing at the second input terminal 12, and $V_{off}$ is the input offset voltage of the operational amplifier 22.

At this time, a potential $V_-$ appearing at the inverting input terminal (−) of the operational amplifier 22 can be expressed by equation (2) below.

Math 2

$$V_- = V_+ + V_{off} = \frac{R2}{R1 + R2}V2 + V_{off} \qquad (2)$$

As shown in the above equation (2), in addition to the input offset voltage $V_{off}$, a potential $V_+$ of the first term appearing at the non-inverting input terminal (+) of the operational amplifier 22 is superimposed on the potential $V_-$ appearing at the inverting input terminal (−) of the operational amplifier 22. Similarly, in the potential fed back from the inverting input terminal (−) of the operational amplifier 22 to the inverting input terminal (−) of the high-precision operational amplifier 31 as well, the potential V1 appearing at the non-inverting input terminal (+) of the operational amplifier 22 is superimposed on the input offset voltage $V_{off}$.

Therefore, to reduce the input offset voltage $V_{off}$ using the high-precision operational amplifier 31, it is preferable to remove the potential $V_+$ appearing at the non-inverting input terminal (+) of the operational amplifier 22 from the potential fed back to the high-precision operational amplifier 31.

Accordingly, in the present embodiment, to remove the potential $V_+$ appearing at the non-inverting input terminal (+) of the operational amplifier 22 from the fed back potential, the reference signal Vb indicating the potential value obtained by equation (3) below is input to the non-inverting input terminal (+) of the high-precision operational amplifier 31.

Math 3

$$Vb = \frac{R2}{R1 + R2}V2 \qquad (3)$$

By setting the reference signal Vb in this way, a potential corresponding to the input offset voltage $V_{off}$ of the operational amplifier 22 can be applied from the output terminal of the high-precision operational amplifier 31 to the non-inverting input terminal (+) of the operational amplifier 22.

Note that it is only necessary to reduce the input offset voltage $V_{off}$ of the operational amplifier 22 using the high-precision operational amplifier 31, and thus the potential value of the reference signal Vb may be shifted from the potential value obtained by the above equation (3) in a range in which the input offset voltage $V_{off}$ of the operational amplifier 22 is reduced. For example, in a case in which the input offset voltage $V_{off}$ of the operational amplifier 22 is sufficiently larger than the potential value obtained by the above equation (3), the potential value of the reference signal Vb may be brought closer to 0 V from the potential value obtained by the above equation (3).

The second resistance element 32 is connected between the output terminal of the high-precision operational amplifier 31 and the output end of the input resistor 212. In this way, the second resistance element 32 is disposed between the output terminal of the high-precision operational amplifier 31 and the output end of the second input resistor 212. The second resistance element 32 is used to adjust the sensitivity of negative feedback control by the high-precision operational amplifier 31, for example. The second resistance element 32 may be used to suppress oscillation of the high-precision operational amplifier 31.

A resistance value R3 of the second resistance element 32 is determined so that the potential applied to the non-inverting input terminal (+) of the operational amplifier 22 by the output signal from the high-precision operational amplifier 31 does not become excessively large compared to the potential appearing at the contact between the input resistor 212 and the first resistance element 24 by the second potential signal V2.

The resistance value R3 of the second resistance element 32 may be the same as or may be different from the resistance value R1 of the input resistor 211 and the input resistor 212 as well as the resistance value R2 of the feedback resistor 23 and the first resistance element 24. The resistance value R3 of the second resistance element 32 in the present embodiment is set to the same value, for example, 2 kΩ, as the resistance value R1 and the resistance value R2.

Note that, in the present embodiment, each of the pair of input resistors 21, the feedback resistor 23, the first resistance element 24, and the second resistance element 32 is realized by one resistor, but may be realized by a plurality of resistors.

Next, a connection configuration of electronic components in the offset voltage suppression circuit 30 will be described.

The inverting input terminal (−) of the high-precision operational amplifier 31 is connected to a contact between the input resistor 211 and the feedback resistor 23 and also connected to the inverting input terminal (−) of the operational amplifier 22, and the output terminal of the high-precision operational amplifier 31 is connected to one end of the second resistance element 32. The other end of the second resistance element 32 is connected to a contact between the input resistor 212 and the first resistance element 24 and also connected to the non-inverting input terminal (+) of the operational amplifier 22. Then, the non-inverting input terminal (+) of the high-precision operational amplifier 31 is connected to the reference signal generation unit 40.

The reference signal generation unit 40 generates and supplies the reference signal Vb to the non-inverting input terminal (+) of the high-precision operational amplifier 31. The reference signal generation unit 40 may be realized by, for example, an external power supply, or may be realized by a circuit that generates the reference signal Vb on the basis of the second potential signal V2 input to the input resistor 212.

Next, the output potential $V_{out}$ appearing at the output terminal 50 of the differential amplifier circuit 100 will be described.

First, in the differential amplifier circuit 100, equation (4) and equation (5) below are derived according to Kirchhoff's law. An adjustment signal $V_{LA}$ appearing at the output terminal of the high-precision operational amplifier 31 can be expressed by equation (6) below, and the potential $V_-$ appearing at the inverting input terminal (−) of the operational amplifier 22 can be expressed by equation (7) below.

Math 4

$$\frac{V1 - V_-}{R1} + \frac{V_{out} - V_-}{R2} = 0 \tag{4}$$

$$\frac{V_{LA} - V_+}{R3} + \frac{V2 - V_+}{R1} + \frac{0 - V_+}{R2} = 0 \tag{5}$$

$$V_{LA} = A(V_{L+} - V_L) = A\left(\frac{R2}{R1 + R2}V2 - V_-\right) \tag{6}$$

$$V_- = V_+ + V_{off} \tag{7}$$

Note that, in the above equation (6), A is an open loop gain of the high-precision operational amplifier 31, $V_{L+}$ is a potential value appearing at the non-inverting input terminal (+) of the high-precision operational amplifier 31, and $V_{L-}$ is a potential value appearing at the inverting input terminal (−) of the high-precision operational amplifier 31. Here, $V_{L+}$ is the reference signal Vb indicating the potential value obtained by the above equation (3).

Next, when the above equation (4) is solved for the potential $V_-$ appearing at the inverting input terminal (−) of the operational amplifier 22, equation (8) below is derived. Further, when the above equation (5) is solved for the potential $V_+$ appearing at the non-inverting input terminal (+) of the operational amplifier 22, equation (9) below is derived.

Math 5

$$V_- = \frac{\frac{V1}{R1} + \frac{V_{out}}{R2}}{\frac{1}{R1} + \frac{1}{R2}} \tag{8}$$

$$V_+ = \frac{\frac{V_{LA}}{R3} + \frac{V_2}{R1}}{\frac{1}{R3} + \frac{1}{R1} + \frac{1}{R2}} \tag{9}$$

Then, the above equation (7) is substituted into the left side of equation (9) and the above equation (6) is substituted into the adjustment signal $V_{LA}$ on the right side of equation (9), deriving equation (10) below.

Math 6

$$V_- - V_{off} = \frac{\frac{A}{R3} \cdot \frac{R2}{R1 + R2} + \frac{1}{R1}}{\frac{1}{R3} + \frac{1}{R1} + \frac{1}{R2}}V2 - \frac{\frac{A}{R3}V_-}{\frac{1}{R3} + \frac{1}{R1} + \frac{1}{R2}} \tag{10}$$

Next, when equation (10) is solved for the potential $V_-$ appearing at the inverting input terminal (−) of the operational amplifier 22, equation (11) below is derived.

Math 7

$$V_- = \tag{11}$$

$$\frac{\frac{A}{R3} \cdot \frac{R2}{R1 + R2} + \frac{1}{R1}}{\frac{1}{R3} + \frac{1}{R1} + \frac{1}{R2}} \cdot \frac{V_2}{1 + \frac{\frac{A}{R3}}{\frac{1}{R3} + \frac{1}{R1} + \frac{1}{R2}}} + \frac{V_{off}}{1 + \frac{\frac{A}{R3}}{\frac{1}{R3} + \frac{1}{R1} + \frac{1}{R2}}}$$

Here, when an equation obtained by substituting the above equation (8) into the left side of equation (11) is solved for the output potential $V_{out}$ of the differential amplifier circuit 100, equation (12) below is derived.

Math 8

$$V_{out} = -\frac{R2}{R1}V1 + \frac{\frac{R2}{R3} + \frac{1}{A}Y}{\frac{R1}{R3} + \frac{1}{A}X}V2 + Z \cdot V_{off} \tag{12}$$

X, Y and Z shown in the equation (12) are respectively as shown in equation (13) below.

Math 9

$$X = 1 + R1\left(\frac{1}{R1} + \frac{1}{R2}\right) \tag{13}$$

$$Y = \frac{R1 + R2}{R1}$$

$$Z = \frac{1}{1 + \frac{A}{R3\left(\frac{1}{R3} + \frac{1}{R1} + \frac{1}{R2}\right)}}Y$$

Here, as long as the open loop gain A of the high-precision operational amplifier 31 is sufficiently large, the conditions of expressions (14) below are satisfied. Therefore, in the output potential $V_{out}$ of the differential amplifier circuit 100, the input offset voltage is reduced so as to be negligible as shown in equation (15) below. Accordingly, the differential amplifier circuit 100 having no input offset voltage can be realized.

Math 10

$$A \gg X, A \gg Y, 0 \approx Z \qquad (14)$$

Math 11

$$V_{out} = -\frac{R2}{R1}(V1 - V2) \qquad (15)$$

In this way, the offset voltage of the operational amplifier 22 can be suppressed by adjusting the resistance value R1 of the pair of input resistors 21, the resistance value R2 of the feedback resistor 23 and the first resistance element 24, and the resistance value R3 of the second resistance element 32 so that the conditions of the above expressions (14) are satisfied.

Next, a configuration example of the reference signal generation unit 40 will be described with reference to FIG. 2.

Figure 2:
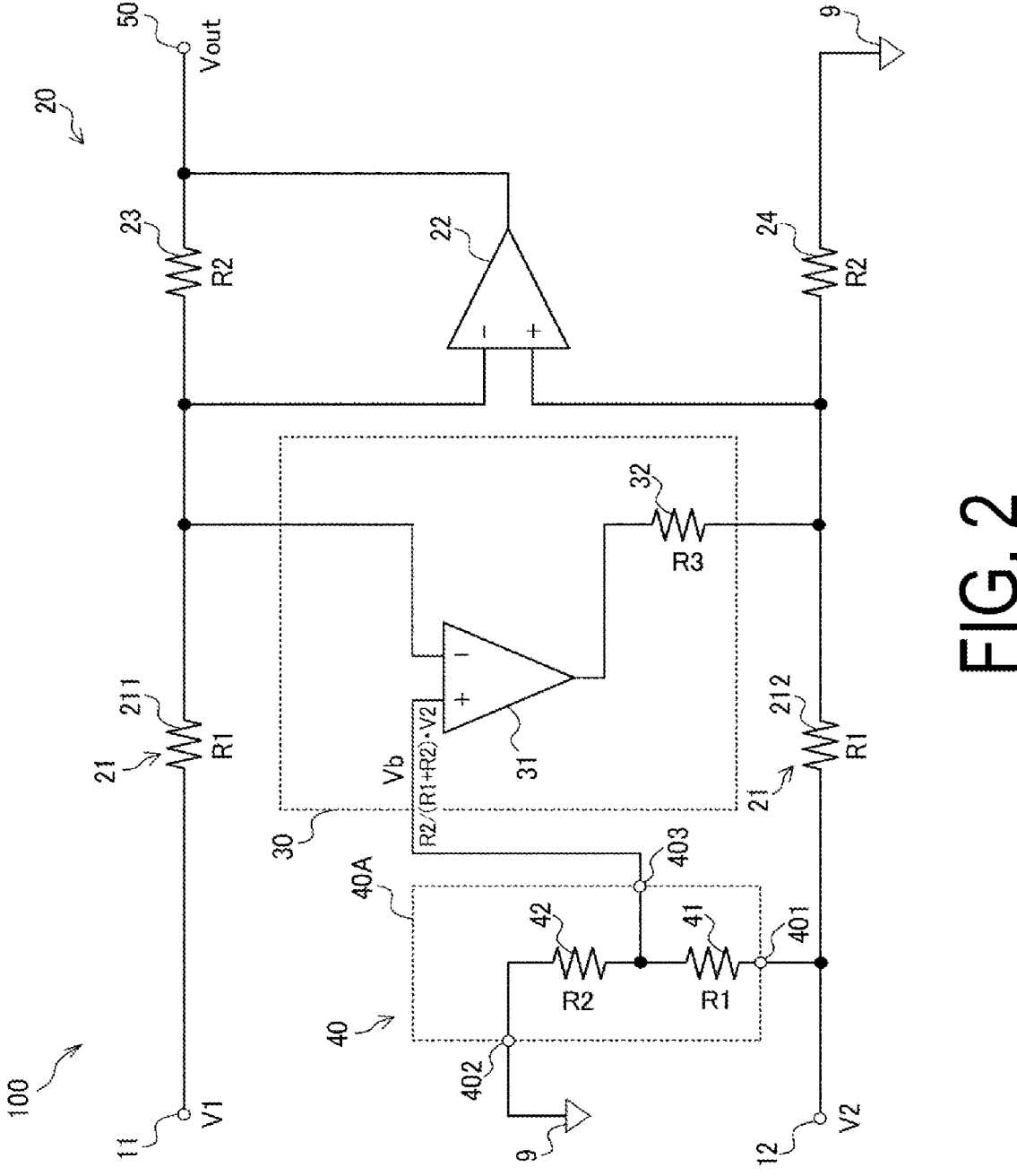
FIG. 2 is a circuit diagram illustrating a detailed configuration of a reference signal generation unit constituting the differential amplifier circuit of the first embodiment.

FIG. 2 is a circuit diagram illustrating a detailed configuration of the reference signal generation unit 40 in the present embodiment. The reference signal generation unit 40 according to the present embodiment is a voltage divider circuit 40A including a fourth resistance element 41 and a fifth resistance element 42 connected in series to each other.

In the voltage divider circuit 40A, an input terminal 401 is connected to the input end of the input resistor 212, and an input terminal 402 is connected to the reference potential terminal 9. Then, an output terminal 403 is connected to the non-inverting input terminal (+) of the high-precision operational amplifier 31.

In the present embodiment, the fourth resistance element 41 is a first resistor having the resistance value R1 equal to that of the input resistor 212, and the fifth resistance element 42 is a second resistor having the resistance value R2 equal to that of the first resistance element 24. That is, the resistance values of the fourth resistance element 41 and the fifth resistance element 42 are determined so that a voltage divider ratio of the fifth resistance element 42 to the fourth resistance element 41 is equal to a voltage divider ratio (R2/R1) of the first resistance element 24 to the input resistor 212. As a result, the reference signal Vb expressed by equation (3) is supplied to the non-inverting input terminal (+) of the high-precision operational amplifier 31.

Note that, as long as the potential of the non-inverting input terminal (+) of the high-precision operational amplifier 31 is the reference signal Vb, the fourth resistance element 41 and the fifth resistance element 42 are not limited to having the resistance value R1 and the resistance value R2, respectively. For example, the resistance values of the fourth resistance element 41 and the fifth resistance element 42 may be different from the resistance values R1, R2, respectively, as long as the voltage divider ratio of the fifth resistance element 42 to the fourth resistance element 41 is equal to the voltage divider ratio of the first resistance element 24 to the input resistor 212.

One end of the fourth resistance element 41 is connected to the input end of the input resistor 212, the other end of the fourth resistance element 41 is connected to one end of the fifth resistance element 42, and the other end of the fifth resistance element 42 is connected to the reference potential terminal 9. Then, the non-inverting input terminal (+) of the high-precision operational amplifier 31 is connected to a contact between the other end of the fourth resistance element 41 and the one end of the fifth resistance element 42.

As described above, the reference signal generation unit 40 generates the reference signal Vb by voltage-dividing the second potential signal V2 input to the input resistor 212 using the fourth resistance element 41 and the fifth resistance element 42 corresponding to the input resistor 212 and the first resistance element 24, respectively. Thus, it is not necessary to prepare an external power supply for generating the reference signal Vb in the differential amplifier circuit 100.

Further, with use of the fourth resistance element 41 and the fifth resistance element 42 corresponding to the input resistor 212 and the first resistance element 24 as well as the second potential signal V2, the reference signal Vb satisfying the above equation (3) is generated with high accuracy, enabling reliable reduction of the offset voltage of the operational amplifier 22.

Note that R3 may be set to 0 in expressions (13). Therefore, the second resistance element 32 need not be provided in the present embodiment. Further, in the present embodiment, it is sufficient that negative feedback is applied between the input terminals of the operational amplifier 22 by the high-precision operational amplifier 31 and thus, for example, a circuit element may be inserted into the negative feedback loop of the high-precision operational amplifier 31.

Next, the effects of the first embodiment will be described.

The differential amplifier circuit 100 of the present embodiment includes the basic differential amplifier circuit 20 including the first and second input resistors 211, 212 configured to respectively receive the two potential signals V1, V2, and the operational amplifier 22 configured to amplify the potential difference between the output ends of the first and second input resistors 211, 212. Furthermore, the basic differential amplifier circuit 20 includes the feedback resistor 23 connected to the output end of the first input resistor 211, and the first resistance element 24 connected to the output end of the second input resistor 212.

Furthermore, the differential amplifier circuit 100 includes the high-precision operational amplifier 31 having an offset voltage or a drift voltage lower than that of the operational amplifier 22. Then, the output end of the first input resistor 211 is directly or indirectly connected to the inverting input terminal (−) of the high-precision operational amplifier 31, and the output end of the second input resistor 212 is directly or indirectly connected to the output terminal of the high-precision operational amplifier 31.

Then, a potential corresponding to a potential appearing at the non-inverting input terminal (+) of the operational amplifier 22 with only the basic differential amplifier circuit 20 is applied as the reference signal Vb to the non-inverting input terminal (+) of the high-precision operational amplifier 31.

According to this configuration, the high-precision operational amplifier 31 is disposed so that negative feedback is applied from the inverting input terminal (−) of the operational amplifier 22 to the non-inverting input terminal (+) of the operational amplifier 22 via the high-precision operational amplifier 31 itself. Then, the reference signal Vb input to the non-inverting input terminal (+) of the high-precision operational amplifier 31 is generated on the basis of the potential appearing at the non-inverting input terminal (+) of the operational amplifier 22 with only the basic differential amplifier circuit 20. Therefore, the high-precision operational amplifier 31 can extract a component corresponding to the offset voltage or the drift voltage of the operational amplifier 22 by acquiring a difference obtained by reducing the potential $V_-$ fed back from the inverting input terminal (−) of the operational amplifier 22 by the reference signal Vb.

Therefore, the high-precision operational amplifier 31 operates so as to provide, in accordance with the extracted difference described above, negative feedback to the non-inverting input terminal (+) of the operational amplifier 22 via the inverting input terminal (−) of the operational amplifier 22 and the inverting input terminal (−) of the high-precision operational amplifier 31. As a result, the potential difference between the input terminals of the operational amplifier 22 is reduced, making it possible to reduce the offset voltage or the drift voltage of the operational amplifier 22. Accordingly, it is possible to reduce the input offset voltage or the drift voltage of the operational amplifier 22 while maintaining the performance of the operational amplifier 22.

In addition, in the differential amplifier circuit 100 according to the present embodiment, the second resistance element 32 is disposed between the output terminal of the high-precision operational amplifier 31 and the output end of the second input resistor 212. This makes it possible to appropriately adjust the sensitivity of the negative feedback control of the high-precision operational amplifier 31. Therefore, the oscillation of the high-precision operational amplifier 31 can be suppressed, for example.

Further, the second resistance element 32 in the present embodiment is connected between the output terminal of the high-precision operational amplifier 31 and the output end of the second input resistor 212. Then, the high-precision operational amplifier 31 feeds back the potential $V_-$ appearing at the inverting input terminal (−) of the operational amplifier 22 and outputs the adjustment signal for reducing the difference between the fed-back potential $V_-$ and the potential of the reference signal Vb to the second resistance element 32.

Further, the differential amplifier circuit 100 according to the present embodiment includes the fourth resistance element 41 and the fifth resistance element 42. One end of the fourth resistance element 41 is connected to the input end of the input resistor 212, and the other end of the fourth resistance element 41 is connected to the non-inverting input terminal (+) of the high-precision operational amplifier 31. One end of the fifth resistance element 42 is connected to the other end of the fourth resistance element 41, and the other end of the fifth resistance element 42 is connected to the reference potential terminal 9.

At this time, the resistance values of the fourth resistance element 41 and the fifth resistance element 42 are determined so that the voltage divider ratio of the fifth resistance element 42 to the fourth resistance element 41 is equal to the voltage divider ratio of the first resistance element 24 to the input resistor 212.

According to this configuration, the reference signal Vb shown in the above equation (3) is supplied from a contact between the fourth resistance element 41 and the fifth resistance element 42 to the non-inverting input terminal (+) of the high-precision operational amplifier 31. Thus, it is possible to reliably extract the potential difference corresponding to the input offset voltage of the operational amplifier 22 in the high-precision operational amplifier 31.

In addition, there is no need to prepare an external power supply, and thus the reference signal Vb can be generated with a simple configuration.

As described above, in the differential amplifier circuit 100, by disposing the fourth resistance element 41 and the fifth resistance element 42 corresponding to the input resistor 212 and the first resistance element 24, respectively, two contradictory effects can be realized simultaneously: high precision of the reference signal Vb and simplification of the circuit configuration.

Further, the reference signal Vb in the present embodiment is determined by the above equation (3). Thus, in the high-precision operational amplifier 31, by subtracting the reference signal Vb from the potential $V_-$ appearing at the inverting input terminal (−) of the operational amplifier 22, it is possible to accurately extract and apply the input offset voltage of the operational amplifier 22 to the non-inverting input terminal (+) of the operational amplifier 22. Accordingly, it is possible to precisely reduce the offset voltage of the operational amplifier 22.

Second Embodiment

According to equations (12) and (13) and expressions (14) described above, the high-precision operational amplifier 31 of the first embodiment is presumably used in a frequency band with a high open loop gain. However, an upper limit of the effective frequency band of the high-precision operational amplifier 31 is lower than the gain bandwidth product of the operational amplifier 22.

As a result, when the two potential signals V1, V2 having frequencies higher than the upper limit of the effective frequency band of the high-precision operational amplifier 31 are input to the differential amplifier circuit 100, the output noise included in the output signal from the high-precision operational amplifier 31 increases.

An embodiment in which a circuit configuration is added as a countermeasure for this will now be described with reference to FIG. 3. This circuit configuration is configured to suppress the effects of output noise that increases in the high-precision operational amplifier 31 in a frequency band higher than the upper limit of the effective frequency band of the high-precision operational amplifier 31.

Note that, in the following, a frequency band higher than the upper limit of the effective frequency band of the high-precision operational amplifier 31 will be referred to as a high-frequency region, and a frequency band lower than the high-frequency region will be referred to as a low-frequency region.

Figure 3:
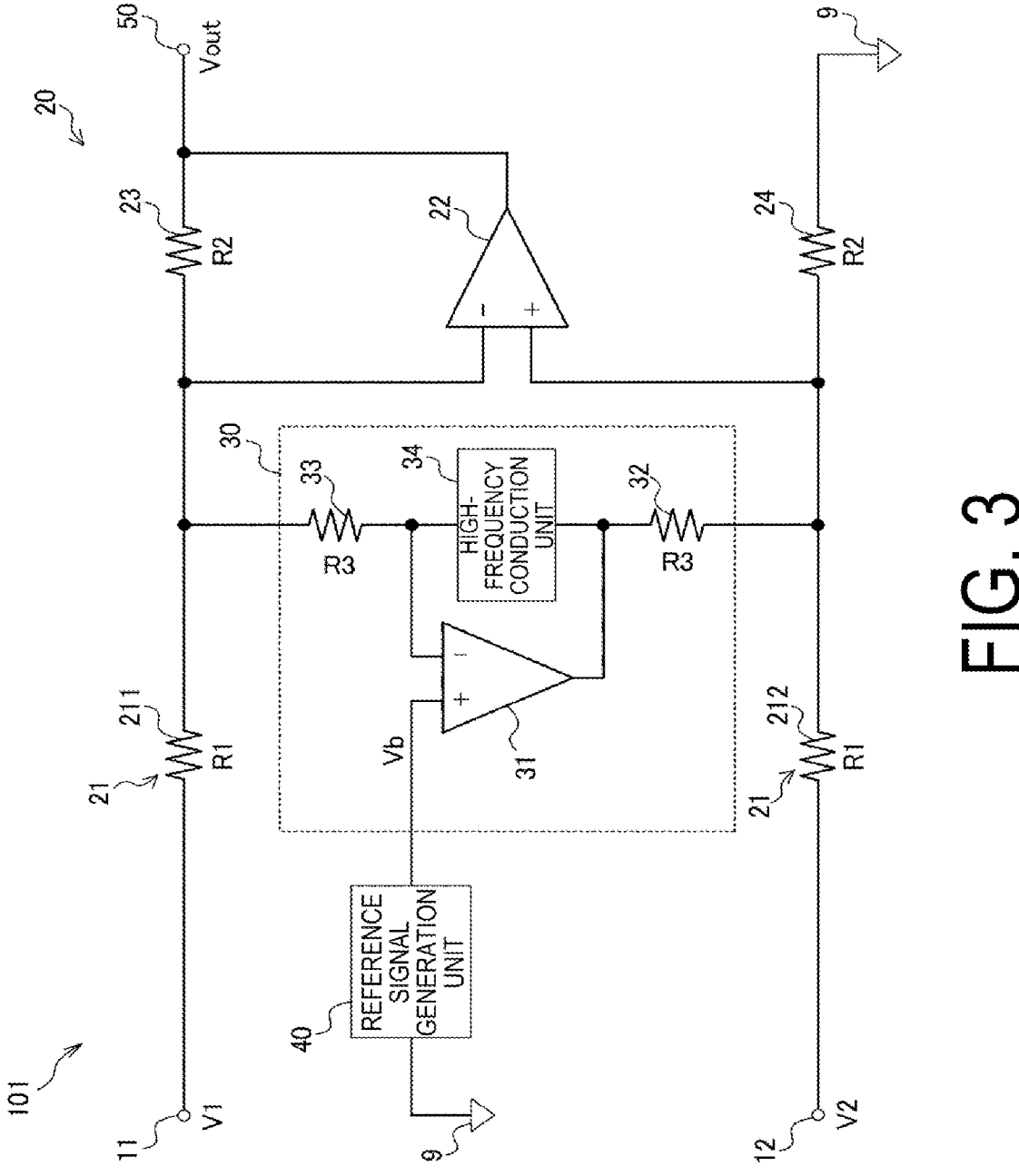
FIG. 3 is a circuit diagram illustrating a configuration of a differential amplifier circuit according to a second embodiment.

FIG. 3 is a circuit diagram illustrating a configuration of a differential amplifier circuit 101 according to a second embodiment.

The differential amplifier circuit 101 includes, in addition to the components of the differential amplifier circuit 100 illustrated in FIG. 1, a third resistance element 33 and a high-frequency conduction unit 34.

In the present embodiment, the configuration of the differential amplifier circuit 101 is basically the same as that of the differential amplifier circuit 100 except for the high-frequency conduction unit 34. Thus, in the description below, configurations that are the same are given the same reference signs, and duplicate descriptions will be omitted.

The operational amplifier 22 in the present embodiment is constituted by a high-speed operational amplifier operable even in the high-frequency region. For example, the gain bandwidth product of the high-speed operational amplifier is about 100 MHz.

The third resistance element 33 and the high-frequency conduction unit 34 have a function of supplying a component of the adjustment signal that is the output of the high-precision operational amplifier 31 to the inverting input terminal (−) of the operational amplifier 22 in the high-frequency region.

In the present embodiment, the third resistance element 33 is set to a resistance value equal to the resistance value R3 of the second resistance element 32 so that the adjustment signal from the high-precision operational amplifier 31 is equally distributed to both the inverting input terminal (−) and the non-inverting input terminal (+) of the operational amplifier 22.

One end of the third resistance element 33 is connected to the output end of the input resistor 211, the inverting input terminal (−) of the operational amplifier 22, and one end of the feedback resistor 23. In the present embodiment, the third resistance element 33 is realized by one resistor, but may be realized by a plurality of resistors. In a case in which the third resistance element 33 is realized by a plurality of resistors, preferably the second resistance element 32 has the same configuration. This makes it possible to equally divide the adjustment signal from the high-precision operational amplifier 31 into two with high accuracy.

The high-frequency conduction unit 34 constitutes a conduction means for conducting current between the output terminal and the inverting input terminal (−) of the high-precision operational amplifier 31 in accordance with an increase (rise) in the frequency of the first or second potential signal V1, V2. The high-frequency conduction unit 34 is constituted by, for example, an element or a switch circuit that allows a high-frequency signal to pass.

As an example, the high-frequency conduction unit 34 includes a switch circuit that switches the feedback path between the output terminal and the inverting input terminal (−) of the high-precision operational amplifier 31 to a conductive state or a non-conductive state in accordance with whether the frequency of the first or second potential signal V1, V2 is higher than a predetermined threshold value. Note that the predetermined threshold value is determined in advance on the basis of the upper limit value of the gain bandwidth product of the high-precision operational amplifier 31, and is set to 100 Hz, for example.

In this example, the high-frequency conduction unit 34 receives a control signal indicating whether the frequency of the first or second potential signal V1, V2 is equal to or lower than the predetermined threshold value. This control signal may be generated by an input operation of a user, or the high-frequency conduction unit 34 may acquire an output signal indicating the frequencies of the potential signals V1, V2 from a frequency analysis sensor (not illustrated) and generate the control signal in accordance with the output signal.

The high-frequency conduction unit 34, upon receipt of the control signal indicating that the frequency of the first or second potential signal V1, V2 is equal to or lower than the predetermined threshold value, controls the switch circuit so that the feedback path between the output terminal and the inverting input terminal (−) of the high-precision operational amplifier 31 is set to a non-conductive state. As a result, the open loop gain of the high-precision operational amplifier 31 becomes sufficiently large, making it possible to reduce the offset voltage of the operational amplifier 22.

On the other hand, the high-frequency conduction unit 34, upon receipt of a control signal indicating that a frequency is higher than the predetermined threshold value, controls the switch circuit so that the feedback path between the output terminal and the inverting input terminal (−) of the high-precision operational amplifier 31 is set to a conductive state. As a result, the high-precision operational amplifier 31 functions as a voltage follower circuit that performs a unity gain operation, and the adjustment signal output from the high-precision operational amplifier 31 is equally distributed to both the second resistance element 32 and the third resistance element 33.

Therefore, signals obtained by equally distributing the adjustment signal from the high-precision operational amplifier 31 are input to the inverting input terminal (−) and the non-inverting input terminal (+) of the operational amplifier 22 as common mode signals, and thus the common mode signals are canceled in the operational amplifier 22.

In this way, the noise that increases in the high-precision operational amplifier 31 due to input of the first potential signal V1 having a frequency higher than the upper limit of the effective frequency band of the high-precision operational amplifier 31 to the high-precision operational amplifier 31 is removed in the operational amplifier 22.

Next, a specific configuration example of the differential amplifier circuit 101 will be described with reference to FIG. 4.

Figure 4:
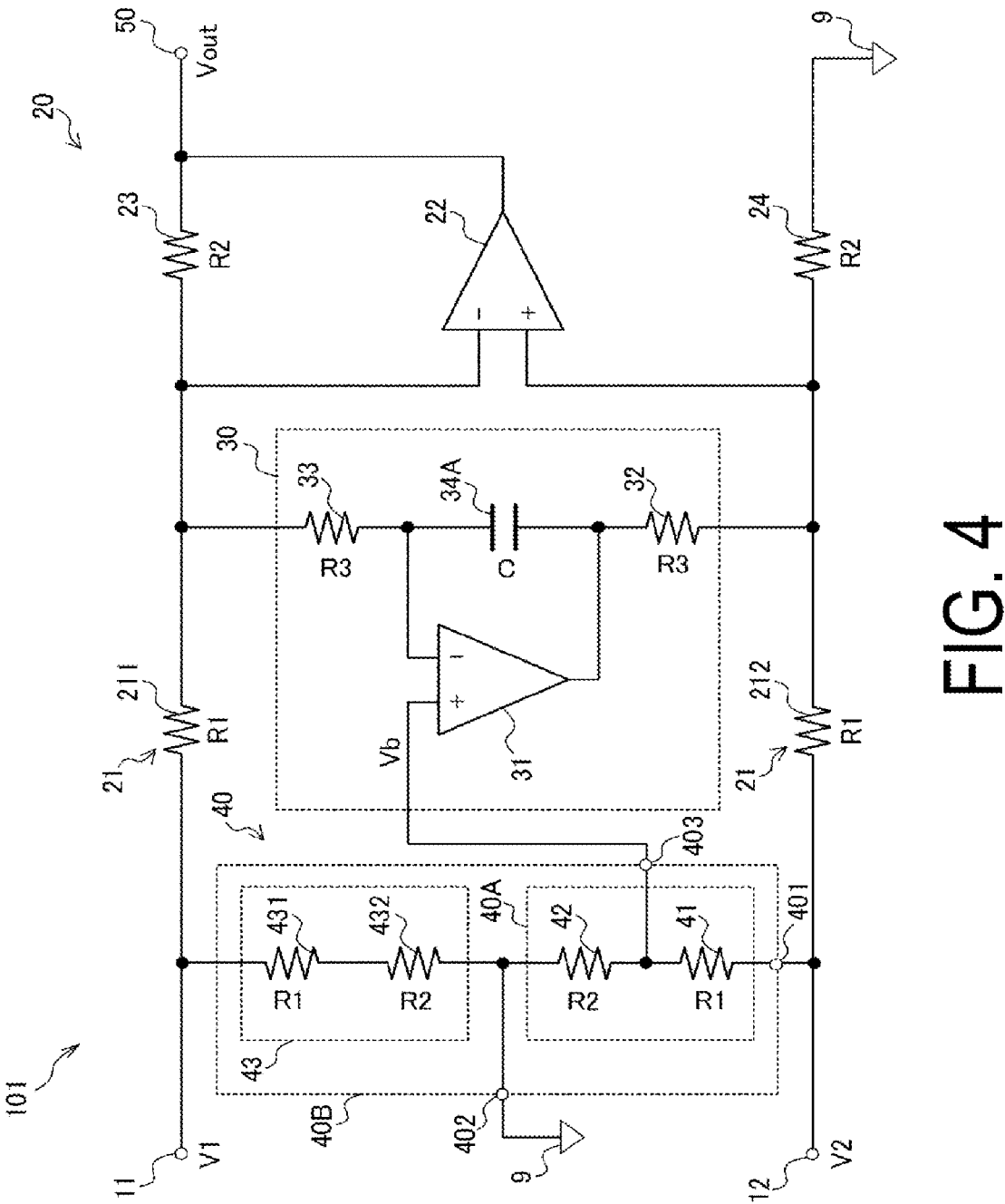
FIG. 4 is a circuit diagram illustrating a detailed configuration of a high-frequency conduction unit and a reference signal generation unit constituting the differential amplifier circuit according to the second embodiment.

FIG. 4 is a circuit diagram illustrating a detailed configuration of the differential amplifier circuit 101 according to the present embodiment. In FIG. 4, a capacitor 34A is illustrated as the high-frequency conduction unit 34, and a voltage divider circuit 40B is illustrated as the reference signal generation unit 40. Other configurations are the same as those of the differential amplifier circuit 101 illustrated in FIG. 3, and thus the configurations of the capacitor 34A and the voltage divider circuit 40B will be mainly described here.

The capacitor 34A is connected between the output terminal and the inverting input terminal (−) of the high-precision operational amplifier 31. Then, the capacitor 34A has a characteristic of decreasing in impedance as the frequency of the first potential signal V1 increases, facilitating conduction.

One end of the capacitor 34A is connected to the other end of the third resistance element 33 and the inverting input terminal (−) of the high-precision operational amplifier 31 and the other end of the capacitor 34A is connected to the one end of the second resistance element 32 and the output terminal of the high-precision operational amplifier 31.

The capacitor 34A in the present embodiment, having a high impedance at or below the upper limit of the effective frequency band of the high-precision operational amplifier 31, is in an isolated state between the output terminal and the inverting input terminal (−) of the high-precision operational amplifier 31. The upper limit of the effective frequency band of the high-precision operational amplifier 31 is, for example, a frequency at which the open loop gain of the high-precision operational amplifier 31 is halved from a maximum value.

On the other hand, the capacitor 34A, having an impedance that decreases in the high-frequency region higher than the upper limit of the effective frequency band of the high-precision operational amplifier 31, conducts current between the output terminal and the inverting input terminal (−) of the high-precision operational amplifier 31.

Therefore, a capacitance C of the capacitor 34A is determined so that the impedance of the capacitor 34A decreases as the frequency of the alternating-current signal input to the capacitor 34A increases from the vicinity of the upper limit of the effective frequency band of the high-precision operational amplifier 31. For example, the capacitance C of the capacitor 34A is set to 100 nF.

Thus, by disposing the capacitor 34A in a feedback path connecting the output terminal and the inverting input terminal (−) of the high-precision operational amplifier 31, the feedback path can be shifted from an isolated state to a conductive state in accordance with the increase in frequency of the first potential signal V1.

Next, the voltage divider circuit 40B functioning as the reference signal generation unit 40 will be described.

The voltage divider circuit 40B includes, in addition to the configuration of the voltage divider circuit 40A illustrated in FIG. 2, a resistance circuit 43 interposed between the input end of the input resistor 211 and the reference potential terminal 9. The resistance circuit 43 is constituted by one or a plurality of resistance elements.

The resistance circuit 43 has a resistance value equal to that of the fourth resistance element 41 and the fifth resistance element 42 connected in series to each other. Specifically, the resistance value of the resistance circuit 43 is set to a value (R1+R2) obtained by adding the resistance value R1 of the fourth resistance element 41 and the resistance value R2 of the fifth resistance element 42.

As a result, a sum of the resistance values of the resistance circuit 43, the input resistor 211, and the feedback resistor 23 is equal to a sum of the resistance values of the fourth resistance element 41, the fifth resistance element 42, the input resistor 212, and the first resistance element 24. That is, a magnitude of a load resistance connected to the first input terminal 11 is, upon comparison, equal to a magnitude of a load resistance connected to the second input terminal 12.

Therefore, a phase of a first current signal transmitted from the first input terminal 11 to the inverting input terminal (−) of the operational amplifier 22 and a phase of a second current signal transmitted from the second input terminal 12 to the non-inverting input terminal (+) of the operational amplifier 22 are likely to match. Accordingly, a signal delay of the second current signal with respect to the first current signal is small compared with that of the voltage divider circuit 40A illustrated in FIG. 2, making it possible to reduce an output error of the operational amplifier 22 caused by the signal delay.

The resistance circuit 43 according to the present embodiment is constituted by a resistance element 431 and a resistance element 432 connected in series. Specifically, one end of the resistance element 431 is connected to the input end of the input resistor 211 and the other end of the resistance element 431 is connected to one end of the resistance element 432. The other end of the resistance element 432 is connected to the reference potential terminal 9.

The resistance element 431 has the same resistance value as that of the fourth resistance element 41 and is constituted by the same components as those of the fourth resistance element 41. The resistance element 432 has the same resistance value as that of the fifth resistance element 42 and is constituted by the same components as those of the fifth resistance element 42.

In this way, by configuring the resistance circuit 43 so as to have symmetry with respect to the fourth resistance element 41 and the fifth resistance element 42 constituting the voltage divider circuit 40A, it is possible to apply a change in the signal characteristics of the second current signal associated with installation of the voltage divider circuit 40A to the first current signal as well. This makes it possible to reduce the output error of the operational amplifier 22 caused by installation of the voltage divider circuit 40A as compared to a case in which only one resistance element having the same resistance value is provided for the fourth resistance element 41 and the fifth resistance element 42.

Next, operation of the differential amplifier circuit 101 according to the present embodiment will be described with reference to FIGS. 5A and 5B.

Figure 5A:
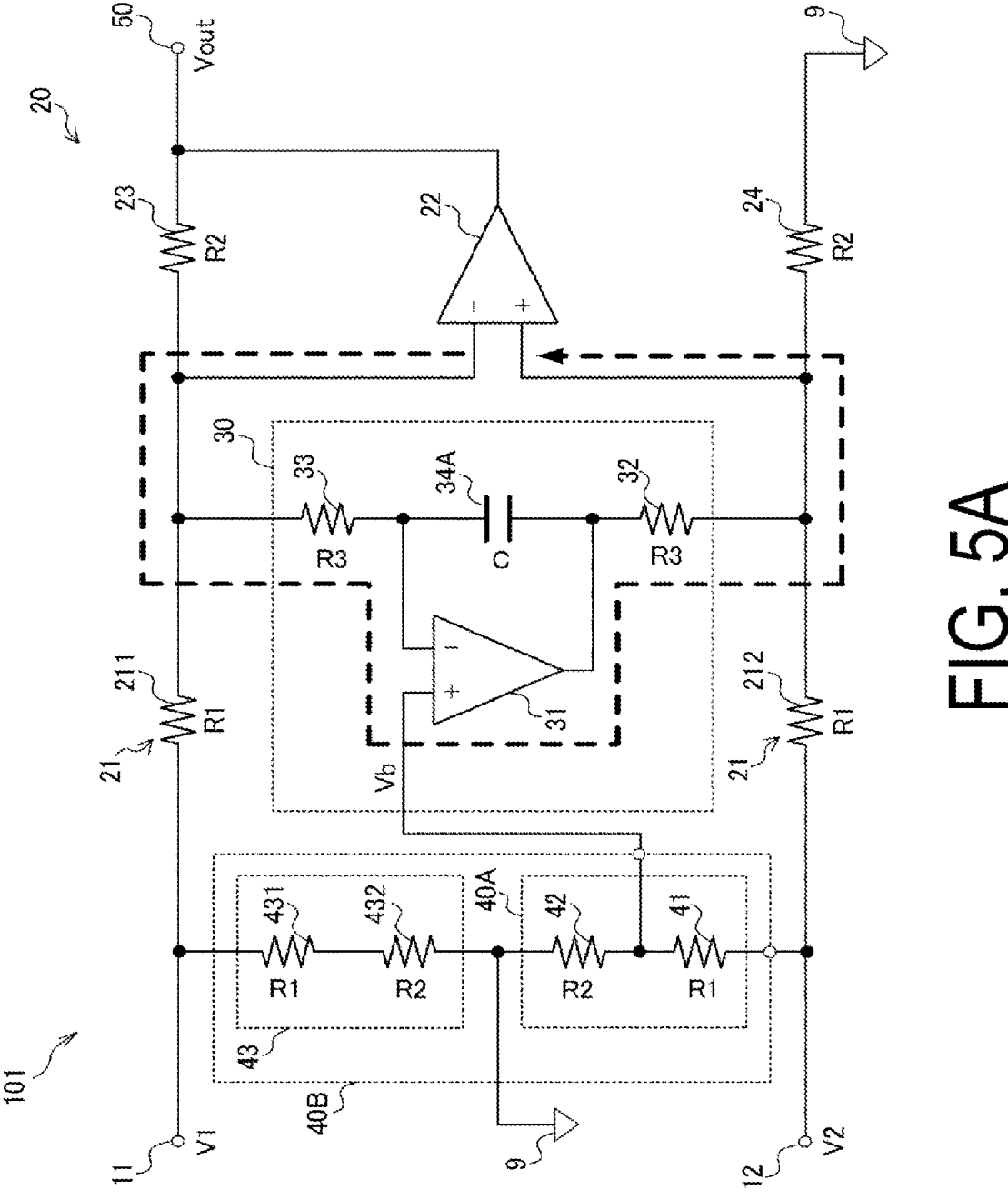
FIG. 5A is a diagram for explaining operation of the differential amplifier circuit in a low-frequency region according to the second embodiment.

FIG. 5A is a diagram for explaining the operation of the differential amplifier circuit 101 when the frequency of the first potential signal V1 is equal to or lower than the upper limit of the effective frequency band of the high-precision operational amplifier 31. FIG. 5B is a diagram for explaining the operation of the differential amplifier circuit 101 when the frequency of the first potential signal V1 is in a high frequency band.

As illustrated in FIG. 5A, in a case in which the frequency of the first potential signal V1 is equal to or lower than the upper limit of the effective frequency band of the high-precision operational amplifier 31, the impedance of the capacitor 34A increases, and the open loop gain of the high-precision operational amplifier 31 becomes sufficiently large. Therefore, the high-precision operational amplifier 31 applies negative feedback from the inverting input terminal (−) to the non-inverting input terminal (+) of the operational amplifier 22 via itself so that the input offset voltage of the operational amplifier 22 decreases.

On the other hand, in a case in which the first potential signal V1 is in a high frequency band, an alternating-current signal having a frequency higher than the upper limit of the effective frequency band is input to the high-precision operational amplifier 31. As a result, the noise generated from the high-precision operational amplifier 31 increases as compared to a case in which an alternating-current signal having a frequency equal to or lower than the upper limit of the effective frequency band is input to the high-precision operational amplifier 31.

Figure 5B:
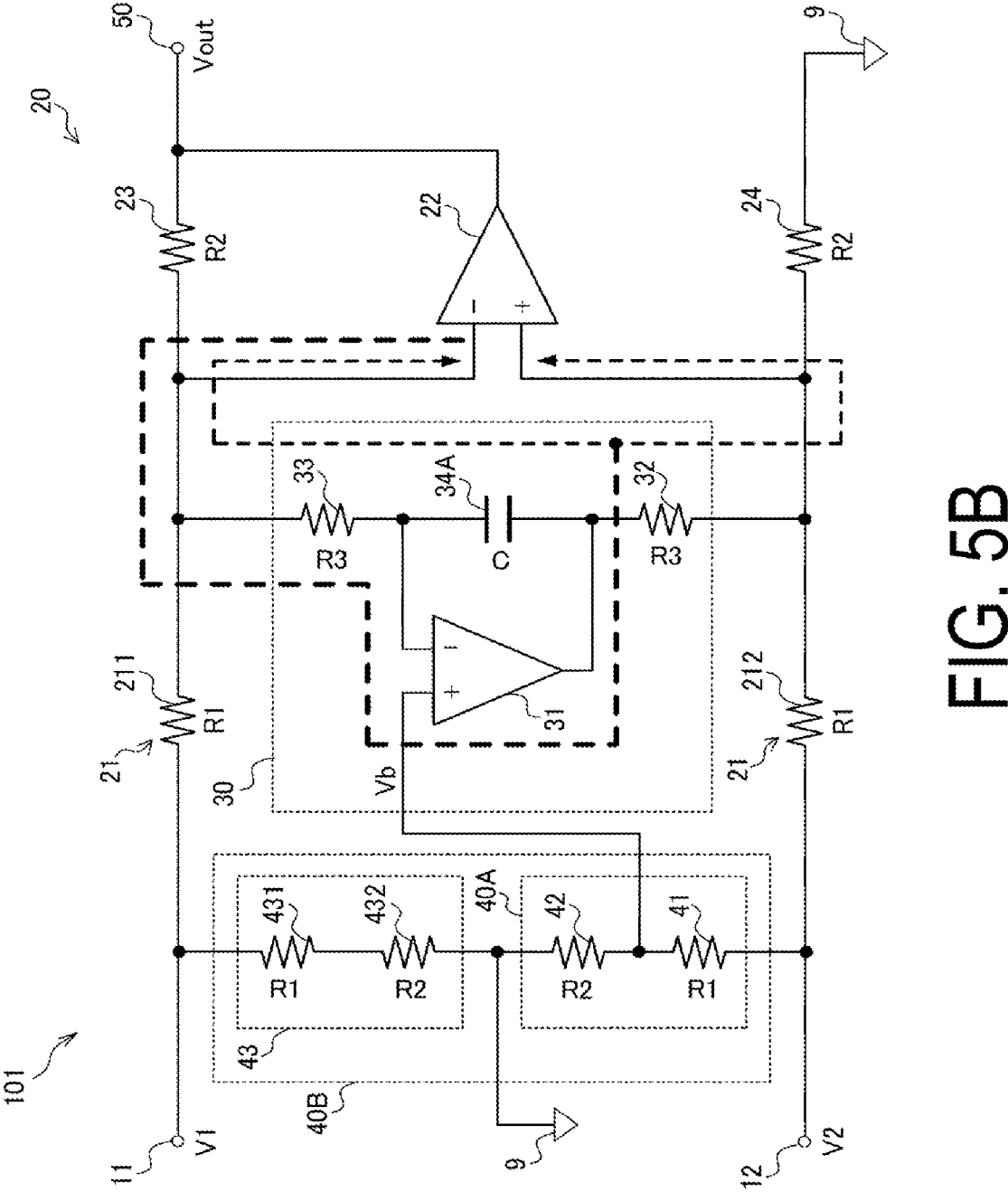
FIG. 5B is a diagram for explaining the operation of the differential amplifier circuit in a high-frequency region according to the second embodiment.

At this time, in a case in which the frequency of the first potential signal V1 is in a high frequency band, the impedance of the capacitor 34A decreases, and the feedback path between the output terminal and the inverting input terminal (−) of the high-precision operational amplifier 31 changes to a conductive state, as illustrated in FIG. 5B.

Therefore, the high-precision operational amplifier 31 operates as a voltage follower circuit and, in a subsequent stage of the output terminal of the high-precision operational amplifier 31, the differential amplifier circuit is constituted by the third resistance element 33, the feedback resistor 23, the second resistance element 32, the first resistance element 24, and the operational amplifier 22.

As a result, the output signal of the high-precision operational amplifier 31 is equally distributed to a first path composed of the third resistance element 33 and the feedback resistor 23 connected to the inverting input terminal (−) of the operational amplifier 22, and a second path composed of the second resistance element 32 and the first resistance element 24 connected to the non-inverting input terminal (+) of the operational amplifier 22. Then, the distribution signals that are equally divided in two are respectively input to the two input terminals of the operational amplifier 22 as common mode signals, and thus the noise included in the output signal of the high-precision operational amplifier 31 is removed in the operational amplifier 22.

Accordingly, even if the frequencies of the first and second potential signals V1, V2 are higher than the upper limit of the effective frequency band of the high-precision operational amplifier 31, the offset voltage or the drift voltage of the operational amplifier 22 can be reduced while suppressing the increased noise that occurs from the high-precision operational amplifier 31.

Note that, although the voltage divider circuit 40B is employed as the reference signal generation unit 40 in the present embodiment, the voltage divider circuit 40A illustrated in FIG. 2 or an external power supply may be employed instead.

Next, frequency characteristics of the differential amplifier circuit 101 will be described with reference to FIGS. 6 to 9. More specifically, an analysis result obtained by executing simulation analysis of the differential amplifier circuit 101 as well as an analysis result of a circuit configuration of only the basic differential amplifier circuit 20, which is a typical differential amplifier circuit, with the offset voltage suppression circuit 30 omitted as a comparison will be described.

Figure 6:
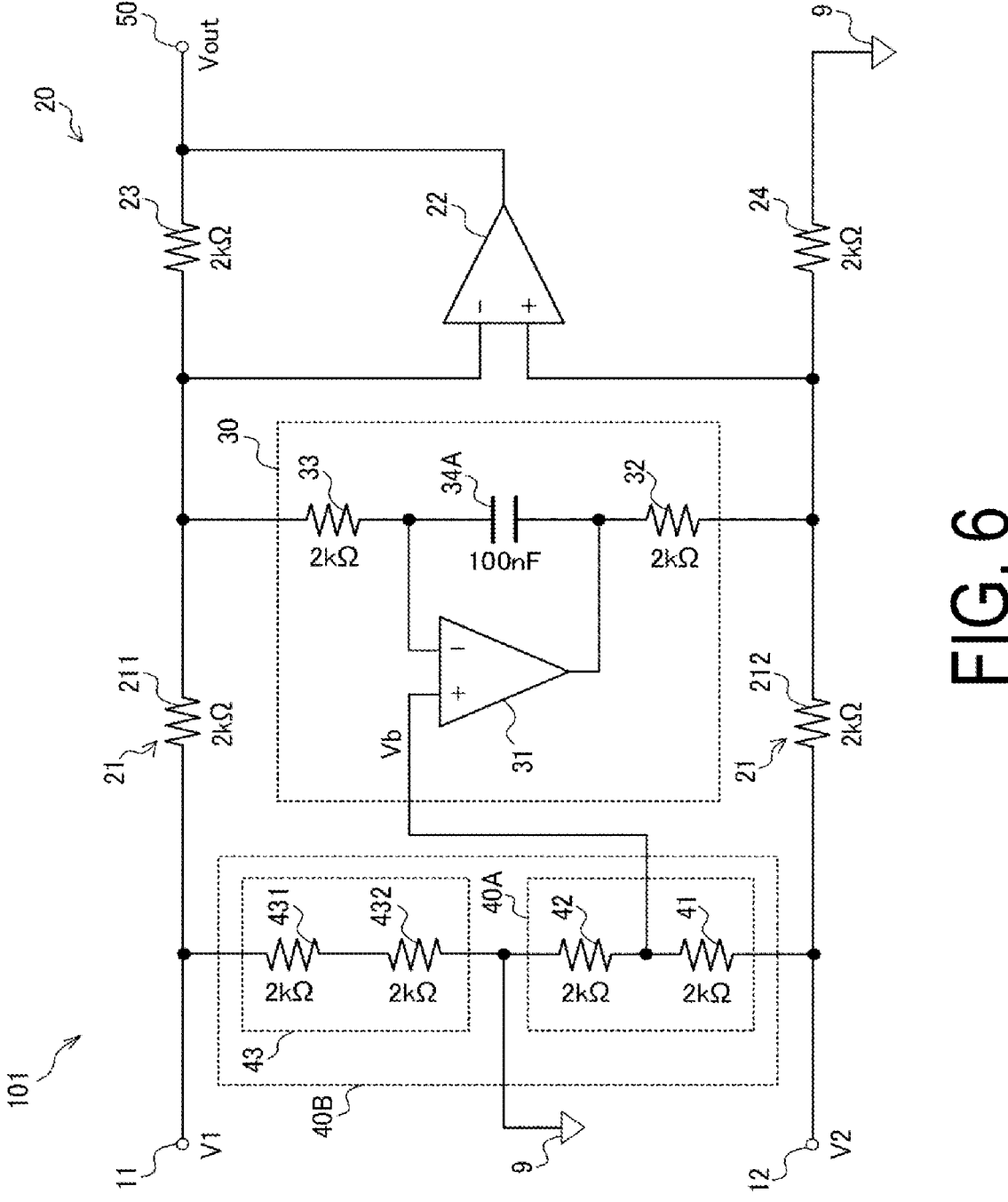
FIG. 6 is a diagram showing setting conditions in a simulation analysis of the differential amplifier circuit according to the second embodiment.

FIG. 6 is a diagram showing numerical values of parameters of the differential amplifier circuit 101 set in the simulation analysis.

In the simulation analysis of the differential amplifier circuit 101, the resistance value R1 of the first and second input resistors 211, 212, the fourth resistance element 41, and the resistance element 431 was set to 2 kΩ, and the resistance value R2 of the feedback resistor 23, the first resistance element 24, the fifth resistance element 42, and the resistance element 432 was set to 2 kΩ. Furthermore, the resistance value R3 of the second resistance element 32 and the third resistance element 33 was also set to 2 kΩ.

Further, the gain bandwidth product of the operational amplifier 22 was set to 145 MHz, and the gain bandwidth product of the high-precision operational amplifier 31 was set to 3 MHz.

Figure 7:
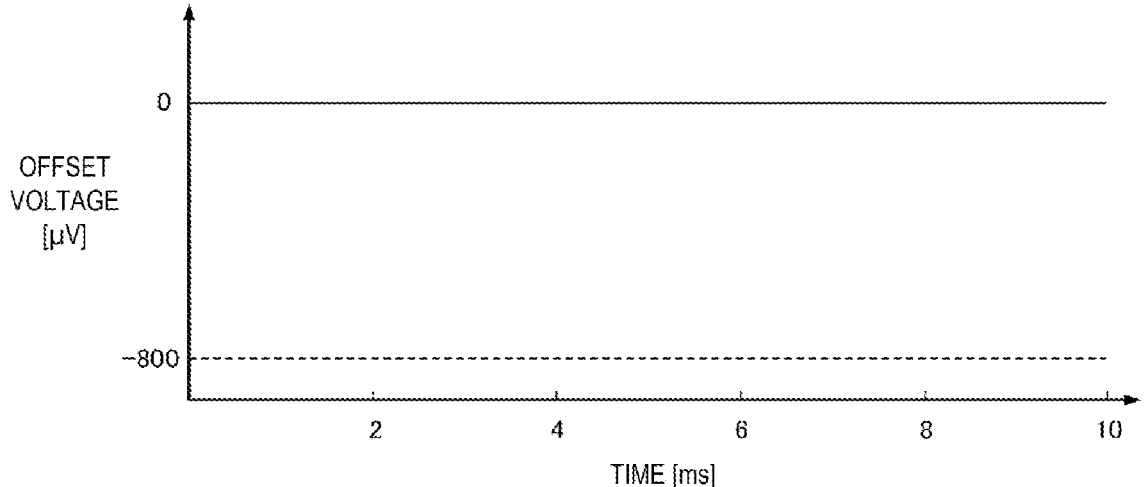
FIG. 7 is a graph showing an example of frequency characteristics related to an offset voltage of the differential amplifier circuit according to the second embodiment.

FIG. 7 is a graph showing an analysis result related to the offset voltage included in the output of the differential amplifier circuit 101 illustrated in FIG. 6.

In FIG. 7, the analysis result of the differential amplifier circuit 101 is indicated by a solid line, the vertical axis indicates the offset voltage [V] of the output of the differential amplifier circuit 101, and the horizontal axis indicates time [ms]. Here, as a comparison, an analysis result of a circuit configuration of only the basic differential amplifier circuit 20 is indicated by a dashed line.

As shown in FIG. 7, in the circuit configuration of only the basic differential amplifier circuit 20, the offset voltage of the output of the operational amplifier 22 remains constant at −800 uV regardless of the increase in the frequencies of the potential signals V1, V2.

On the other hand, in the differential amplifier circuit 101 including the offset voltage suppression circuit 30, the input offset voltage of the high-precision operational amplifier 31 having a low offset voltage is lower than the input offset voltage of the operational amplifier 22 and is constant at substantially zero (0) uV. Therefore, the offset voltage of the output of the operational amplifier 22 is substantially 0 uV as in the high-precision operational amplifier 31.

In this way, the high-precision operational amplifier 31 in which the reference signal Vb is input to the non-inverting input terminal (+) is disposed so that negative feedback is applied from the inverting input terminal (−) to the non-inverting input terminal (+) of the operational amplifier 22, making it possible to reduce the offset voltage of the output of the operational amplifier 22.

Next, frequency characteristics related to the output noise of the differential amplifier circuit 101 will be described.

Figure 8A:
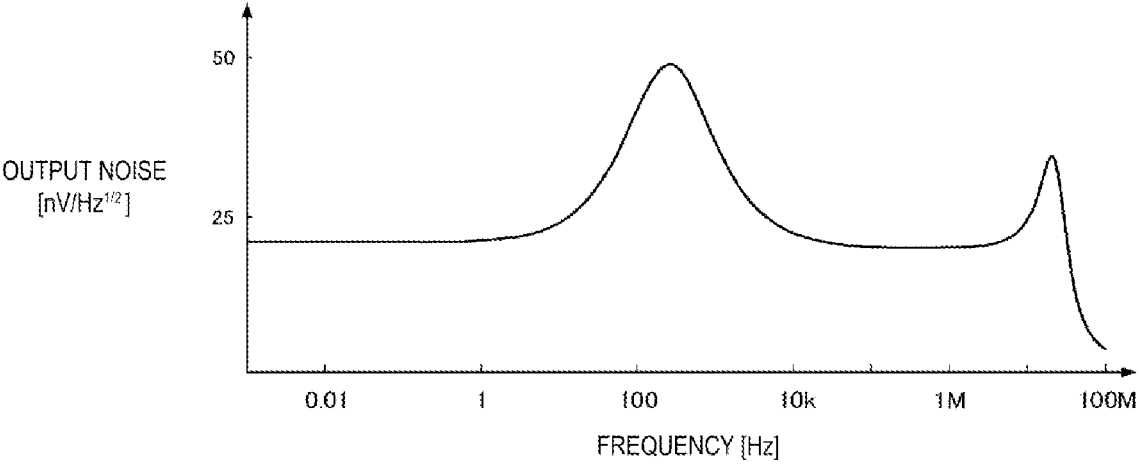
FIG. 8A is a graph showing an example of frequency characteristics related to output noise of the differential amplifier circuit according to the second embodiment.
Figure 8B:
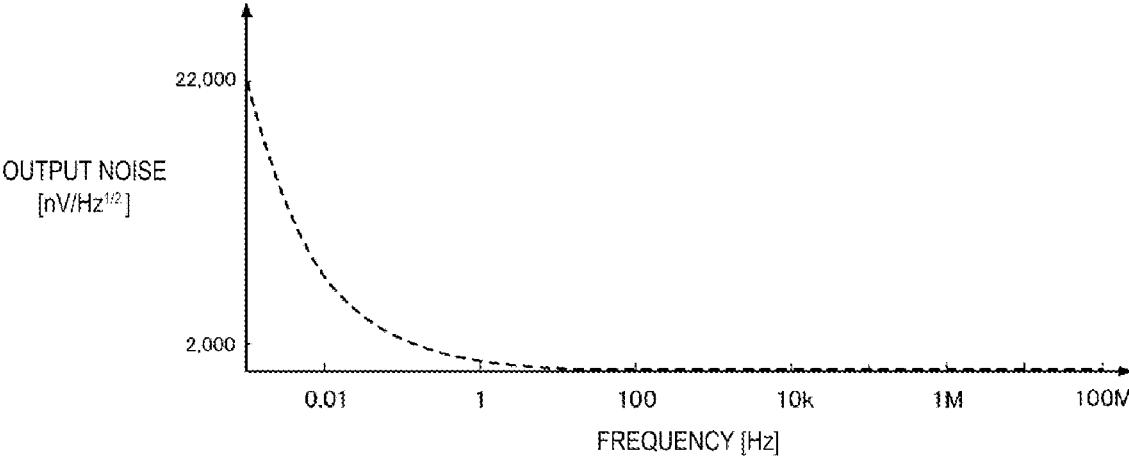
FIG. 8B is a graph showing an example of frequency characteristics related to output noise of only a basic differential amplifier circuit as a comparison.

FIG. 8A is a graph showing an analysis result of the frequency characteristics related to the output noise of the differential amplifier circuit 101 illustrated in FIG. 6, and FIG. 8B is a graph showing an analysis result of the frequency characteristics related to the output noise of only the basic differential amplifier circuit 20.

The horizontal axes in FIGS. 8A and 8B are common frequency axes and indicate the frequencies of the two potential signals V1, V2. The vertical axis in FIG. 8A indicates a noise voltage density per 1 Hz in the output noise from the differential amplifier circuit 101, and the vertical axis in FIG. 8B indicates a noise voltage density of the output noise from only the basic differential amplifier circuit 20.

As shown in FIGS. 8A and 8B, in the low-frequency region, the output noise from the differential amplifier circuit 101 is an extremely small value of about one-thousandth compared to the output noise of only the basic differential amplifier circuit 20 used as a comparison. In other words, in the differential amplifier circuit 101, the 1/f noise is sufficiently reduced.

The output noise becomes extremely small because the voltage signal input to the inverting input terminal (−) of the operational amplifier 22 is negatively fed back to the non-inverting input terminal (+) of the operational amplifier 22 via the high-precision operational amplifier 31. Thus, the output noise in the low-frequency region is determined by the characteristics of the high-precision operational amplifier 31, reducing the noise component of the signal output from the operational amplifier 22.

Next, frequency characteristics related to a common mode rejection ratio (CMRR) of the differential amplifier circuit 101 will be described.

Figure 9:
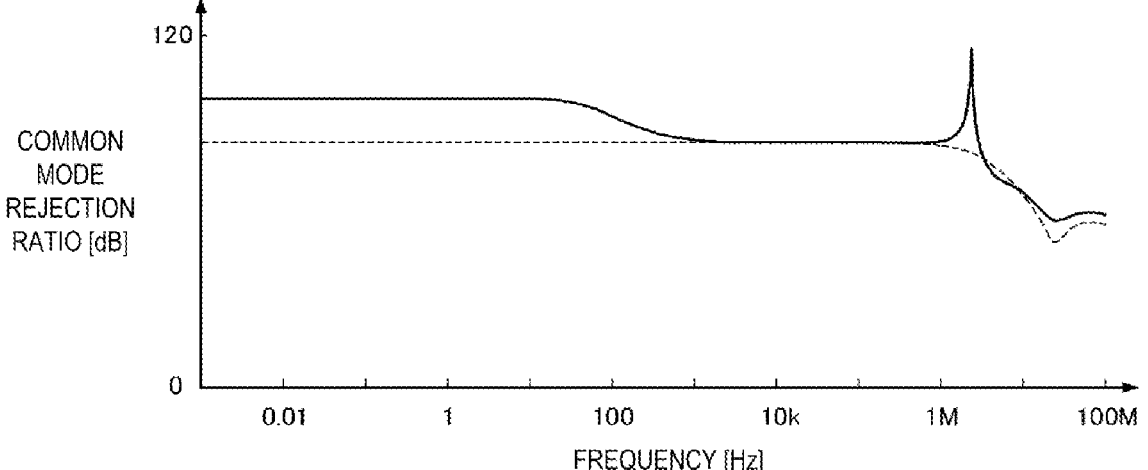
FIG. 9 is a graph showing an example of frequency characteristics related to a common mode rejection ratio of the differential amplifier circuit according to the second embodiment.

FIG. 9 is a graph showing a result of simulation analysis of the frequency characteristics related to the common mode rejection ratio of the differential amplifier circuit 101 illustrated in FIG. 6. This analysis result takes into account variations in the resistance elements constituting the differential amplifier circuit 101.

In FIG. 9, the analysis result of the differential amplifier circuit 101 is indicated by a solid line, the vertical axis indicates the common mode rejection ratio of the differential amplifier circuit 101, and the horizontal axis indicates the frequencies of the two potential signals V1, V2 input to the differential amplifier circuit 101. Here, as a comparison, an analysis result of a circuit configuration of only the basic differential amplifier circuit 20, which is a typical differential amplifier circuit, is indicated by a dashed line.

As shown in FIG. 9, in the low-frequency region, the common mode rejection ratio of the differential amplifier circuit 101 is high compared to the common mode rejection ratio of the circuit configuration including only the basic differential amplifier circuit 20.

This is because, as described with FIGS. 8A and 8B, negative feedback is applied from the inverting input terminal (−) of the operational amplifier 22 to the non-inverting input terminal (+) of the operational amplifier 22 by the high-precision operational amplifier 31. Furthermore, the common mode signal component is canceled in the operational amplifier 22, improving the common mode rejection ratio.

On the other hand, in the high-frequency region, the common mode rejection ratio of the differential amplifier circuit 101 is maintained at a level equal to the common mode rejection ratio of the circuit configuration including only the basic differential amplifier circuit 20.

This is because the capacitor 34A disposed in the feedback path of the high-precision operational amplifier 31 changes to a conductive state, and the common mode signals obtained by dividing the output signal from the high-precision operational amplifier 31 performing a unity gain operation into two are input to the two input terminals of the operational amplifier 22.

As a result, the common mode signals are removed by the differential amplifier circuit constituted by the operational amplifier 22, the first to third resistance elements 24, 32, 33, and the feedback resistor 23, making it possible to reduce the output noise of the high-precision operational amplifier 31 associated with the operating frequency range being surpassed. This makes it possible to suppress a significant decrease in the common mode rejection ratio of the operational amplifier 22.

As described above, in the differential amplifier circuit 101, a common mode rejection ratio equal to or higher than that of the circuit configuration including only the basic differential amplifier circuit 20, which is a typical differential amplifier circuit, can be realized across an entire band equal to or lower than the frequency band of the basic differential amplifier circuit 20 constituted by the operational amplifier 22.

Now, the effects of the second embodiment will be described.

The differential amplifier circuit 101 according to the present embodiment has the same effects as those of the differential amplifier circuit 100 according to the first embodiment.

Furthermore, in the present embodiment, the high-frequency conduction unit 34 is provided as a conduction means for conducting current between the output terminal and the inverting input terminal (−) of the high-precision operational amplifier 31 in accordance with an increase in the frequency of the potential signal V1 input to the first input resistor 211.

According to this configuration, as illustrated in FIG. 5B, the adjustment signal from the high-precision operational amplifier 31 is split into two, and the two common mode signals obtained by the splitting are input to the two input terminals of the operational amplifier 22. As a result, the two common mode signals obtained by the splitting cancel each other out in the operational amplifier 22, making it possible to reduce the output noise increased by the high-precision operational amplifier 31 in the high-frequency region.

Further, the high-frequency conduction unit 34 according to the present embodiment includes the capacitor 34A connected between the output terminal and the inverting input terminal (−) of the high-precision operational amplifier 31. By using the capacitor 34A, it is possible to pass an alternating-current signal between the output terminal and the inverting input terminal (−) of the high-precision operational amplifier 31 in the high-frequency region while achieving a simple circuit configuration of the high-frequency conduction unit 34.

Thus, in a case in which the frequencies of the potential signals V1, V2 are higher than a predetermined threshold value, the high-precision operational amplifier 31 performs a unity gain operation as a voltage follower circuit. Then, the high-precision operational amplifier 31 outputs an adjustment signal indicating a difference between the potential V_ fed back from the inverting input terminal (−) of the operational amplifier 22 and the reference signal Vb to both the second resistance element 32 and the other third resistance element 33.

Therefore, the common mode signals obtained by dividing the output signal of the high-precision operational amplifier 31 into two are respectively supplied to the two input terminals of the operational amplifier 22, making it possible to reduce the increased noise included in the output signal of the high-precision operational amplifier 31 in the operational amplifier 22.

Further, the differential amplifier circuit 101 according to the present embodiment further includes the third resistance element 33 connected between the output end of the first input resistor 211 and the inverting input terminal (−) of the high-precision operational amplifier 31. The third resistance element 33 has the resistance value R3 equal to that of the second resistance element 32.

Therefore, the common mode signals obtained by equally dividing the output signal of the high-precision operational amplifier 31 into two are respectively supplied to the two input terminals of the operational amplifier 22, making it possible to remove the increased noise included in the output signal of the high-precision operational amplifier 31 in the operational amplifier 22.

In the present embodiment, the differential amplifier circuit 101 includes the fourth resistance element 41 having the resistance value R1 equal to that of the second input resistor 212, and the fifth resistance element 42 having the resistance value R2 equal to that of the first resistance element 24. That is, the resistance values of the fourth resistance element 41 and the fifth resistance element 42 are determined so that the voltage divider ratio of the fifth resistance element 42 to the fourth resistance element 41 is, upon comparison, equal to the voltage divider ratio of the first resistance element 24 to the input resistor 212.

One end of the fourth resistance element 41 is connected to the input end of the second input resistor 212, the other end of the fourth resistance element 41 is connected to one end of the fifth resistance element 42, and the other end of the fifth resistance element 42 is connected to the reference potential terminal 9. The non-inverting input terminal (+) of the high-precision operational amplifier 31 is connected between the fourth resistance element 41 and the fifth resistance element 42.

In addition, the differential amplifier circuit 101 includes the resistance circuit 43 interposed between the input end of the first input resistor 211 and the reference potential terminal 9 and having a resistance value (R1+R2) equal to that of the fourth resistance element 41 and the fifth resistance element 42 connected in series to each other.

With the resistance circuit 43 disposed between the input end of the first input resistor 211 and the reference potential terminal 9 as described above, the load resistance connected to the input end of the first input resistor 211 and the load resistance connected to the input end of the second input resistor 212 are equal to each other. Therefore, a delay between the current signals supplied to the two input terminals of the operational amplifier 22 is reduced compared to that in a case in which the resistance circuit 43 is not disposed, making it possible to reduce the output error of the operational amplifier 22 caused by the delay.

The operational amplifier 22 in the present embodiment is a high-speed operational amplifier having a gain bandwidth product of several MHz or higher. Thus, in the differential amplifier circuit 101, it is possible to reduce the offset voltage or the drift voltage of the high-speed operational amplifier while maintaining the performance of the high-speed operational amplifier.

The embodiments of the present invention described above merely illustrate a portion of the application examples of the present invention, and the technical scope of the present invention is not intended to be limited to the specific configurations of the embodiments described above.

For example, although the voltage divider circuit 40A is provided as the reference signal generation unit 40 in the differential amplifier circuit 100 according to the first embodiment, the voltage divider circuit 40B illustrated in FIG. 4 may be provided instead. In this case as well, similarly to the second embodiment, the delay between the current signals supplied to the two input terminals of the operational amplifier 22 can be reduced.

Further, although the second resistance element 32 and the third resistance element 33 are disposed in the offset voltage suppression circuit 30 in the second embodiment, a capacitor may be connected in parallel to each of the second resistance element 32 and the third resistance element 33.

The present application claims priority based on JP 2020-168100 filed on Oct. 2, 2020 in Japan, the entire contents of which are incorporated by reference herein.

REFERENCE SIGNS LIST

20 Basic differential amplifier circuit
21 Pair of input resistors
211, 212 First input resistor, second input resistor
23 Feedback resistor
24 First resistance element
31 High-precision operational amplifier
32, 33 Second resistance element, third resistance element
34 High-frequency conduction unit (conduction means)
34A Capacitor
41, 42 Fourth resistance element, fifth resistance element
43 Resistance circuit
100, 101 Differential amplifier circuit

The invention claimed is:

1. A differential amplifier circuit comprising:
a basic differential amplifier circuit including
a first input resistor and a second input resistor configured to respectively receive two potential signals,
an operational amplifier configured to amplify a potential difference between output ends of the first input resistor and the second input resistor,
a feedback resistor including one end connected to the output end of the first input resistor and another end connected to an output terminal of the operational amplifier, and
a first resistance element including one end connected to the output end of the second input resistor and another end connected to a reference potential terminal; and
a high-precision operational amplifier including an inverting input terminal connected to the output end of the first input resistor and an output terminal connected to the output end of the second input resistor, the high-precision operational amplifier having an offset voltage or a drift voltage lower than an offset voltage or a drift voltage of the operational amplifier, wherein
a potential corresponding to a potential appearing at a non-inverting input terminal of the operational amplifier with only the basic differential amplifier circuit is input as a reference signal to the non-inverting input terminal of the high-precision operational amplifier.

2. The differential amplifier circuit according to claim 1, wherein a second resistance element is disposed between the output terminal of the high-precision operational amplifier and the output end of the second input resistor.

3. The differential amplifier circuit according to claim 2, further comprising:
a conduction means configured to conduct current between the output terminal and the inverting input terminal of the high-precision operational amplifier in accordance with an increase in a frequency of the potential signal input to the first input resistor.

4. The differential amplifier circuit according to claim 3, wherein the conduction means includes a capacitor connected between the output terminal and the inverting input terminal of the high-precision operational amplifier.

5. The differential amplifier circuit according to claim 3, further comprising:
a third resistance element connected between the output end of the first input resistor and the inverting input terminal of the high-precision operational amplifier, wherein
the third resistance element has a resistance value equal to a resistance value of the second resistance element.

6. The differential amplifier circuit according to claim 5, wherein, when a frequency of the potential signal is higher than a predetermined threshold value, the high-precision operational amplifier function as a voltage follower circuit, outputs an adjustment signal to the second resistance element and the third resistance element.

7. The differential amplifier circuit according to claim 2, comprising:
a fourth resistance element including one end connected to an input end of the second input resistor and the other end connected to the non-inverting input terminal of the high-precision operational amplifier; and
a fifth resistance element including one end connected to the other end of the fourth resistance element and the other end connected to the reference potential terminal, wherein
resistance values of the fourth resistance element and the fifth resistance element are determined such that a voltage divider ratio of the fifth resistance element to the fourth resistance element is equal to a voltage divider ratio of the first resistance element to the second input resistor.

8. The differential amplifier circuit according to claim 7, further comprising:
a resistance circuit interposed between an input end of the first input resistor and the reference potential terminal and having a resistance value equal to a resistance value of the fourth resistance element and the fifth resistance element connected in series to each other.

9. The differential amplifier circuit according to claim 2, wherein the operational amplifier is a high-speed operational amplifier having a gain bandwidth product of several MHz or greater.

10. The differential amplifier circuit according to claim 1, wherein the reference signal is determined by equation (1) below, Math 1

$$Vb = \frac{R2}{R1 + R2} V2 \tag{1}$$

where,
Vb is the reference signal,
V2 is the potential signal input to the second input resistor,
R1 is a resistance value of the second input resistor, and
R2 is a resistance value of the first resistance element.

* * * * *